(12) United States Patent
Takazawa

(10) Patent No.: US 9,738,989 B2
(45) Date of Patent: Aug. 22, 2017

(54) SINGLE-CRYSTAL MANUFACTURING APPARATUS AND METHOD OF MANUFACTURING SINGLE CRYSTAL

(71) Applicant: SHIN-ETSU HANDOTAI CO., LTD., Tokyo (JP)

(72) Inventor: Masanori Takazawa, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 102 days.

(21) Appl. No.: 14/895,172

(22) PCT Filed: May 28, 2014

(86) PCT No.: PCT/JP2014/002807
§ 371 (c)(1),
(2) Date: Dec. 1, 2015

(87) PCT Pub. No.: WO2014/208000
PCT Pub. Date: Dec. 31, 2014

(65) Prior Publication Data
US 2016/0115620 A1 Apr. 28, 2016

(30) Foreign Application Priority Data
Jun. 27, 2013 (JP) ................................. 2013-135423

(51) Int. Cl.
*C30B 15/32* (2006.01)
*C30B 15/00* (2006.01)
*C30B 29/06* (2006.01)

(52) U.S. Cl.
CPC .............. *C30B 15/32* (2013.01); *C30B 15/00* (2013.01); *C30B 29/06* (2013.01)

(58) Field of Classification Search
CPC ......... C30B 15/00; C30B 15/14; C30B 15/20; C30B 15/30; C30B 15/32; C30B 29/00;
(Continued)

(56) References Cited

U.S. PATENT DOCUMENTS 5,292,487 A * 3/1994 Tatsumi .................. C30B 15/14
117/201
5,942,032 A 8/1999 Kim et al.
2005/0000403 A1 * 1/2005 Asahi ...................... C30B 15/12
117/13

FOREIGN PATENT DOCUMENTS

CN 1265712 A 9/2000
CN 1556257 A 12/2004
(Continued)

OTHER PUBLICATIONS

Aug. 26, 2014 International Search Report issued in International Patent Application No. PCT/JP2014/002807.
(Continued)

*Primary Examiner* — Kenneth A Bratland, Jr.
(74) *Attorney, Agent, or Firm* — Oliff PLC

(57) ABSTRACT

A single-crystal manufacturing apparatus including: main chamber accommodating crucible and heater; pull chamber wherein a grown single-crystal is received; gas-flow guiding cylinder that has opening through which the single-crystal passes and extends downward from ceiling of main chamber; seed chuck configured to hold a seed crystal; and heat insulation plate that is level with lower end of the opening of gas-flow guiding cylinder when raw material is heated and melted, and pulled together with the seed crystal when single-crystal is pulled. The seed chuck includes a mounting fixture to mount heat insulation plate. Mounting fixture has a mechanism allowing heat insulation plate to be mounted so the heat insulation plate can be rotated independently of the rotation of the seed chuck. This apparatus can be readily
(Continued)

introduced, melt raw material with low heater power; inhibit occurrence of dislocation during seeding and generation of dislocation in single-crystal when single-crystal is pulled.

6 Claims, 4 Drawing Sheets

(58) Field of Classification Search
CPC ......... C30B 29/02; C30B 29/06; C30B 35/00; C30B 35/002
USPC ............ 117/11, 13, 35, 200, 204, 206, 208, 117/217–218, 911, 928, 931–932
See application file for complete search history.

(56) References Cited

FOREIGN PATENT DOCUMENTS

| | | |
|---|---|---|
| CN | 202214446 U | 5/2012 |
| JP | H0642967 U | 6/1994 |
| JP | 2000007497 A | 1/2000 |
| JP | 3719329 B2 | 11/2005 |
| JP | 2006044962 A | 2/2006 |
| JP | 2009179524 A | 8/2009 |
| JP | 2011219312 A | 11/2011 |
| JP | 2012091942 A | 5/2012 |

OTHER PUBLICATIONS

Apr. 1, 2017 Search Report issued in Chinese Patent Application No. 2014800362867.

* cited by examiner

SINGLE-CRYSTAL MANUFACTURING APPARATUS AND METHOD OF MANUFACTURING SINGLE CRYSTAL

TECHNICAL FIELD

The present invention relates to a single-crystal manufacturing apparatus and a method of manufacturing a single crystal by the Czochralski method.

BACKGROUND ART

Manufacture of semiconductor single crystals having a diameter of 450 mm or more by the Czochralski (CZ) method needs a single-crystal manufacturing apparatus to have a large opening in its hot zone or the apparatus itself so as to allow each semiconductor single crystal being manufactured to pass through the interior of the apparatus. As the area of this opening is increased, an exposed area of polycrystalline silicon raw material contained in a quartz crucible to a chamber is increased. This increase facilitates heat transfer due to radiation between the polycrystalline silicon raw material and the chamber when the polycrystalline silicon raw material is melted, thereby making it difficult to increase the temperature of the polycrystalline silicon raw material.

Accordingly, a high power heater is needed to melt the polycrystalline silicon raw material. This imposes a great burden on the quartz crucible containing the polycrystalline silicon raw material, thereby heavily damaging the quartz crucible. A long operation consequently becomes impossible. There is a need for a manufacturing apparatus that can melt the polycrystalline silicon raw material with a low heater power.

When large diameter crystals, particularly crystals having a large diameter of 450 mm or more and a long length are manufactured, a dash necking method cannot be used, because a neck portion in the dash necking method has a thin width of about 2 to 3 mm and is hence too weak to hold a heavy crystal. Manufacture of crystals by a dislocation-free seeding method is accordingly needed in which a crystal diameter can be optionally selected during its growth after the seeding. In this dislocation-free seeding method, the minimum crystal diameter after the seeding is previously determined such that this diameter allows a single crystal having a prescribed weight to be held; the growth of this single crystal is started after a seed crystal with a sharp end is slowly dipped into a melt of polycrystalline silicon raw material such that the diameter of the grown crystal is within the range of the minimum diameter.

The dislocation-free seeding method, however, literally needs dislocation-free seeding. It is accordingly necessary to prevent the single crystal from generating dislocation after the seeding due to dislocation generated in the seed crystal by a thermal shock caused by difference in temperature between the seed crystal and the melt of polycrystalline silicon raw material. The seed crystal needs to be heated to reduce this difference in temperature between the seed crystal and the melt before the seeding process. A method of heating the seed crystal that is usually used is to move the seed crystal to right above the melt and heat the seed crystal by radiant heat from the melt surface.

However, an increase in diameter of the opening through which the single crystal passes during its growth is accompanied with the enlargement of the diameter of a silicon single crystal to be manufactured, and facilitates heat transfer due to radiation between a seed chuck holding the seed crystal and a chamber, thereby making it impossible to sufficiently heat the seed crystal in the process of heating the seed crystal before the seeding. A success rate of the dislocation-free seeding is thereby greatly reduced.

CITATION LIST

Patent Literature

Patent Document 1: Japanese Unexamined Patent publication (Kokai) No. 2012-91942
Patent Document 2: Japanese Unexamined Patent publication (Kokai) No. 2006-44962

SUMMARY OF INVENTION

Technical Problem

Various techniques to solve this problem have been developed. One of these techniques will be described below.

Patent Document 1 discloses a heat insulation plate that can ascend and descend independently of the seed chuck during seeding is provided near the surface of the melt of raw material. This technique needs considerable modifications of an existing single-crystal manufacturing apparatus and thus has a demerit of being difficult to apply.

Patent Document 2 discloses a heat insulation plate is attached to the seed chuck and allows the melt surface to maintain its temperature during seeding. However, when this method is used to manufacture a silicon single crystal having a large diameter of 450 mm or more, the weight and area of the heat insulation plate are increased to cover the opening having an increased diameter, through which a grown silicon single crystal passes. This increase in weight and area of the heat insulation plate increases the moment of inertia of the heat insulation plate, thereby preventing the rotation of the silicon single crystal when the heat insulation plate is raised by the seed chuck. Accordingly, stable crystal growth cannot be achieved. In the worst case, the silicon single crystal generates dislocation during its growth.

The present invention was accomplished in view of the above problems. It is an object of the present invention to provide a single-crystal manufacturing apparatus that can readily be introduced, melt the raw material with a low heater power, reduce the occurrence of dislocation during seeding, and inhibit a single crystal from generating dislocation when the single crystal is pulled.

Solution to Problem

To achieve this object, the present invention provides a single-crystal manufacturing apparatus comprising: a main chamber accommodating a crucible configured to contain raw material and a heater to heat the raw material into a raw material melt; a pull chamber in which a grown single crystal is pulled and received, the pull chamber being continuously provided above the main chamber; a gas-flow guiding cylinder having an opening through which the single crystal passes, the gas-flow guiding cylinder extending downward from a ceiling of the main chamber; a heat insulation plate that is level with a lower end of the opening of the gas-flow guiding cylinder when the raw material is heated and melted, and pulled together with the seed crystal when the single crystal is pulled; and a rotatable seed chuck configured to hold a seed crystal, the seed chuck including a mounting fixture to mount the heat insulation plate, the mounting fixture having a mechanism allowing the heat insulation plate to be mounted such that the heat insulation plate can be rotated independently of the rotation of the seed chuck, the single-crystal manufacturing apparatus being configured to manufacture the single crystal while pulling the seed crystal and the heat insulation plate.

Such a single-crystal manufacturing apparatus can inhibit heat transfer due to radiation from the raw material to the chamber when the raw material is heated and melted, and melt the raw material even when the heater has a low power. In addition, the apparatus can inhibit heat transfer due to radiation from the raw material melt, seed crystal, and seed chuck to the chamber during seeding, and maintain the temperature of the seed crystal sufficiently heated, thereby enabling the inhibition of the occurrence of dislocation even when the dislocation-free seeding method is used. The apparatus can also inhibit the rotational speed of the silicon crystal from temporally decreasing due to the heat insulation plate having a large moment of inertia when the single crystal is pulled, thereby enabling stable crystal growth. The generation of dislocation in the single crystal and contamination due to impurities can consequently be inhibited during the pulling. The invention needs only the modification of the seed chuck and can therefore be readily introduced to an existing single-crystal manufacturing apparatus.

The mounting fixture preferably includes an annular lower flange extending from a side surface of the seed chuck and an annular upper flange being rotatable independently of the rotation of the seed chuck while putting the heat insulation plate thereon, an annular groove is preferably formed on an upper surface of the lower flange and a lower surface of the upper flange, and three or more spheres are preferably interposed between the annular grooves formed on the upper surface of the lower flange and the lower surface of the upper flange such that the upper flange is placed above the lower flange through the spheres.

Such an apparatus allows the heat insulation plate and the upper flange to rotate through the spheres independently of the body of the seed chuck and prevents the heat insulation plate from contacting the body of the seed chuck, thereby enabling the inhibition of creation of fine pieces. The contamination of the single crystal due to impurities can consequently reliably be inhibited during pulling. This mounting fixture is easy to construct and can more readily be introduced to an existing single-crystal manufacturing apparatus.

The lower flange can have a wall protruding upward at an outermost circumference of the lower flange.

This lower flange can reliably inhibit falling of fine pieces that may be produced by frictional contact between the upper flange and the heat insulation plate onto the silicon melt surface. The generation of dislocation and contamination due to impurities in the single crystal can consequently be more reliably inhibited during pulling.

The invention also provides a method of manufacturing a single crystal by using the inventive single-crystal manufacturing apparatus.

This method of manufacturing a single crystal can inhibit heat transfer due to radiation from the raw material to the chamber when the raw material is heated and melted, and melt the raw material even when the heater has a low power. In addition, the apparatus can inhibit heat transfer due to radiation from the raw material melt, seed crystal, and seed chuck to the chamber during seeding, and maintain the temperature of the seed crystal sufficiently heated, thereby enabling the inhibition of the occurrence of dislocation even when the dislocation-free seeding method is used. The apparatus can also inhibit the rotational speed of the silicon crystal from temporally decreasing due to the heat insulation plate having a large moment of inertia when the single crystal is pulled, thereby enabling stable crystal growth. The generation of dislocation and contamination due to impurities in the single crystal can consequently be inhibited during the pulling. The invention needs only the modification of the seed chuck and can therefore be readily introduced to an existing single-crystal manufacturing apparatus.

Advantageous Effects of Invention

A single-crystal manufacturing apparatus according to the invention can melt the raw material even when the heater has a low electric power, sufficiently heat the seed crystal and maintain this temperature during seeding, thereby enabling the inhibition of the occurrence of dislocation. This apparatus can also inhibit temporary reduction of the rotational speed of the silicon crystal when the heat insulation plate is mounted on the seed chuck, thereby enabling the inhibition of the generation of dislocation in the silicon crystal. The invention needs only the modification of the seed chuck and can therefore be readily introduced to an existing single-crystal manufacturing apparatus.

DESCRIPTION OF EMBODIMENTS

An embodiment of the present invention will hereinafter be described, but the present invention is not limited to this embodiment.

In recent years, production of a single crystal having a long length and a large diameter, particularly a diameter of 450 mm or more, needs a heat insulation plate to cover the opening of a gas-flow guiding cylinder to maintain the temperature of a hot zone during melting the raw material and seeding. When the heat insulation plate is raised by a seed chuck, however, the rotation of a silicon single crystal is disturbed and dislocation is hence generated in the silicon single crystal during its growth.

Accordingly, the inventor diligently conducted studies to solve this problem and consequently found that if a mounting fixture to mount the heat insulation plate on the seed chuck is provided with a mechanism that allows the heat insulation plate to be mounted such that the heat insulation plate can be rotated independently of the rotation of the seed chuck, the rotation of the silicon single crystal is hardly disturbed, and the silicon single crystal can thereby be inhibited from generating dislocation during its growth. The inventor thereby brought the invention to completion.

An example of a single-crystal manufacturing apparatus according to the invention will now be described with reference to FIG. 1, FIG. 2, FIG. 3, and FIG. 4.

Figure 1:
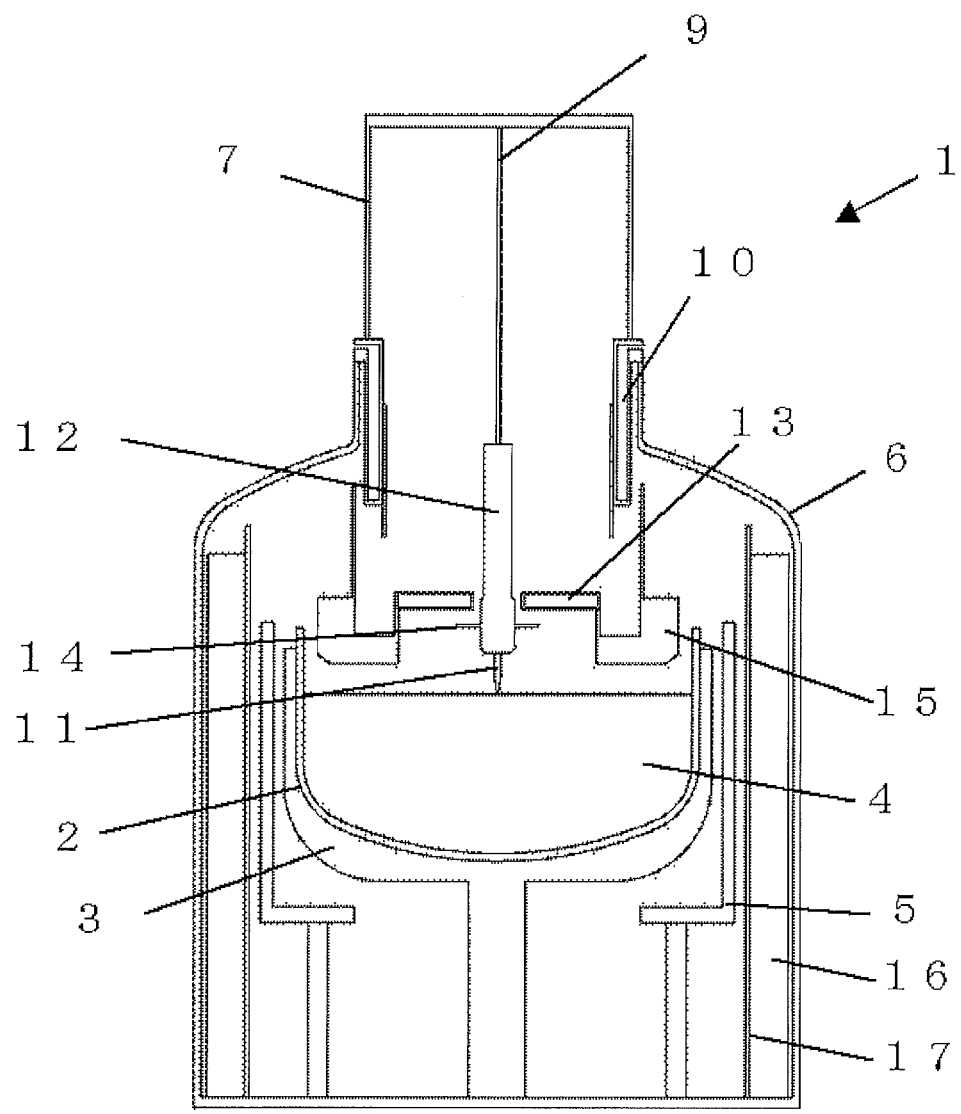
FIG. 1 is a cross-sectional view showing an example of a single-crystal manufacturing apparatus according to the invention when seeding.
Figure 2:
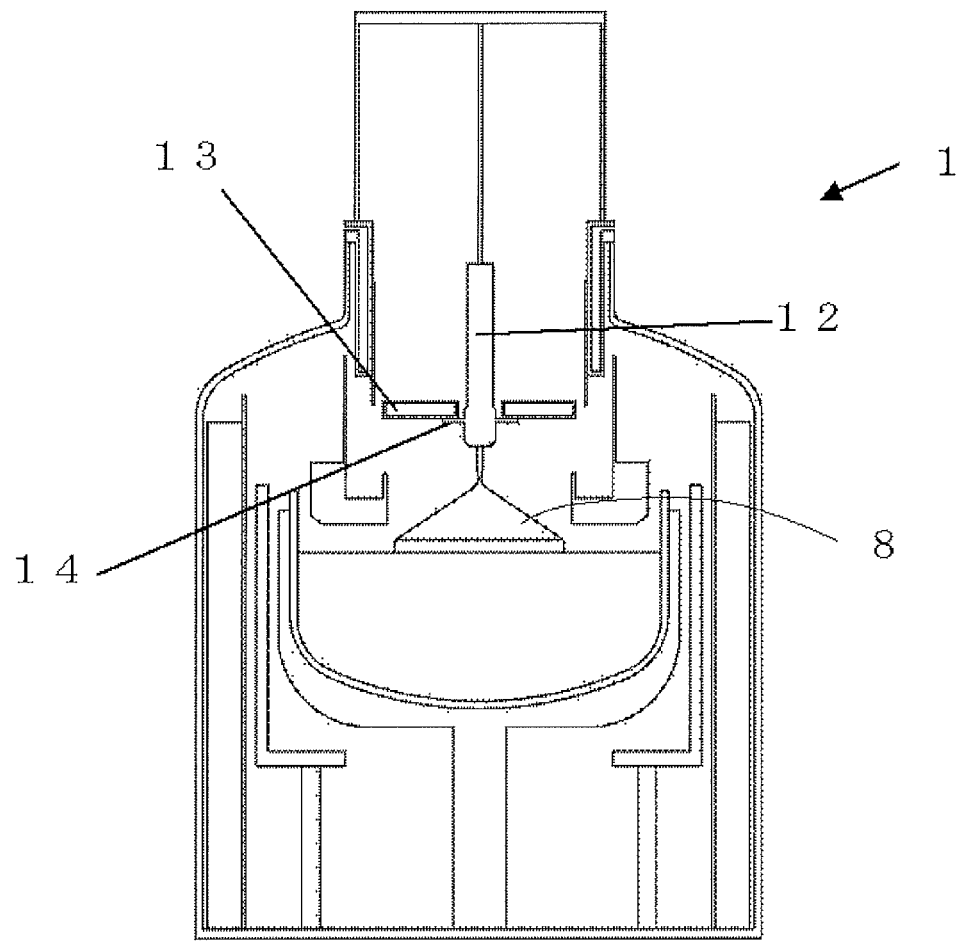
FIG. 2 is a cross-sectional view showing an example of a single-crystal manufacturing apparatus according to the invention when a single crystal is pulled.

As shown in FIG. 1 and FIG. 2, in the inventive single-crystal manufacturing apparatus 1, crucibles 2 and 3 to contain the raw material, and a heater 5 to heat the raw material into a melt 4 of the raw material are accommodated in a main chamber 6. A wire 9 configured to pull a single crystal 8 is provided at an upper portion of a pull chamber 7 that is continuously provided above the main chamber 6. The crucibles 2 and 3 are formed of a quartz crucible 2 to directly receive the raw material melt 4 on the inside and a graphite crucible 3 to support the quartz crucible 2 on the outside.

The apparatus is also provided with a gas-flow guiding cylinder 10 that has an opening through which the single crystal 8 passes and extends downward from the ceiling of the main chamber 6, and a rotatable seed chuck 12 to hold a seed crystal 11 at the end of the wire 9. As shown in FIG. 2, this seed crystal 11 attached to the end of the seed chuck 12 is dipped into the raw material melt 4 and the wire 9 is reeled to pull the seed chuck 12, so that the single crystal 8 is formed below the seed crystal 11.

The heater 5 is disposed so as to surround the crucibles 2 and 3. A heat insulation material 16 is disposed between the heater 5 and the main chamber 6 so as to surround the heater 5. This heat insulation material 16 can shield radiant heat from the heater 5. A protector 17 to protect the heat insulation material is disposed inside the heat insulation material 16.

In the invention, the seed chuck 12 includes a mounting fixture 14 to mount a heat insulation plate 13. The mounting fixture 14 has a mechanism that allows the heat insulation plate 13 to be mounted such that the heat insulation plate 13 can be rotated independently of the rotation of the seed chuck 12.

Figure 3:
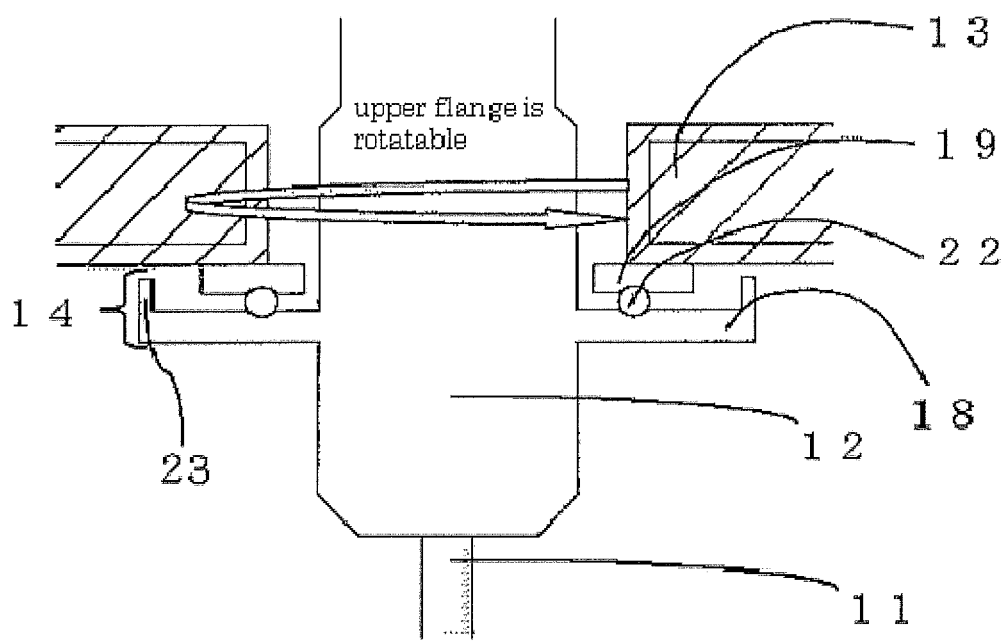
FIG. 3 is a cross-sectional view showing an exemplary seed chuck having a mounting fixture according to the invention.
Figure 4:
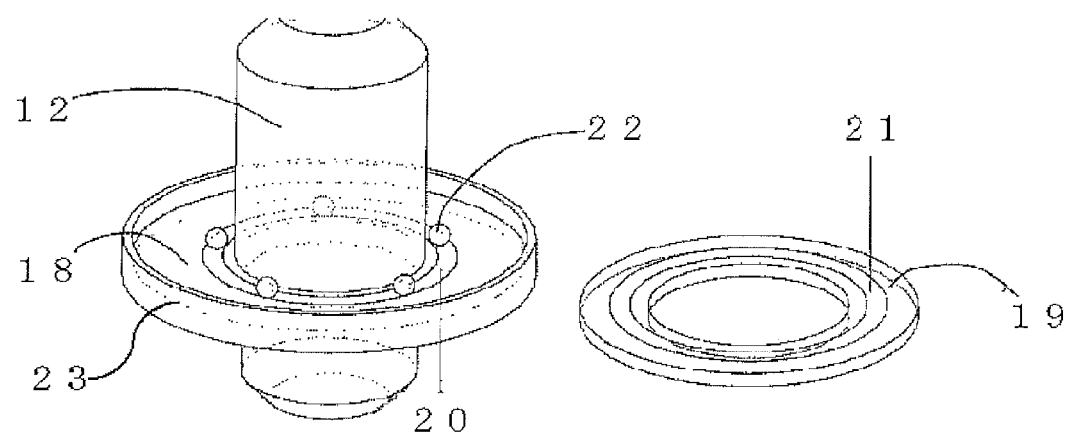
FIG. 4 is a perspective view showing an exemplary seed chuck having a mounting fixture according to the invention.

As shown in FIG. 3 and FIG. 4, the mechanism of the mounting fixture 14 preferably includes an annular lower flange 18 that extends from a side surface of the seed chuck 12 and an annular upper flange 19 that is rotatable independently of the rotation of the body of the seed chuck 12 while putting the heat insulation plate 13 on its upper face. Annular grooves 20 and 21 are preferably formed on the upper surface of the lower flange 18 and the lower surface of the upper flange 19, respectively. Three or more spheres 22 are preferably interposed between the annular grooves 20 and 21 formed on the upper surface of the lower flange 18 and the lower surface of the upper flange 19 such that the upper flange 19 is placed above the lower flange 18 through the spheres 22.

This configuration allows the upper flange 19 and the heat insulation plate 13 to rotate though the spheres 22 independently of the lower flange 18, and prevents contact between the heat insulation plate 13 and the body of the seed chuck 12 during the pulling, thereby enabling the inhibition of the occurrence of fine pieces due to friction. The apparatus can consequently inhibit some generated fine pieces from attaching to the surface of the single crystal 8 during its growth and from falling on the raw material melt 4 and thereby reliably inhibit the generation of dislocation and contamination due to impurities in the single crystal 8. The mounting fixture 14 has a simple configuration as shown in FIG. 3 and FIG. 4 and can thereby be more readily introduced to an existing single-crystal manufacturing apparatus.

The number of the spheres 22 is preferably determined such that the spheres 22 can rotate and spreads so as to always keep the upper flange 19 horizontal.

As shown in FIG. 3 and FIG. 4, the lower flange 18 can have a wall 23 protruding upward at its outermost circumference.

This lower flange 18 can reliably inhibit falling of fine pieces, which may be produced by frictional contact between the upper flange 19 and the heat insulation plate 13, on the raw material melt 4 and attachment of these fine pieces to the surface of the single crystal 8 during pulling. The generation of dislocation in the single crystal during the pulling and contamination due to impurities can consequently be more reliably inhibited.

When the raw material is heated and melted, the seed chuck 12 that holds no seed crystal 11 is moved to right above the raw material and the heat insulation plate 13 is placed on a heat-insulating ring 15 attached to the lower end of the opening of the gas-flow guiding cylinder 10 so that the temperature around the raw material is maintained.

As shown in FIG. 1, the heat insulation plate 13 is placed on the heat-insulating ring 15 during seeding to maintain the temperature of the seed crystal 11, seed chuck 12, and the raw material melt 4. It is to be noted that although this embodiment discloses that when the raw material is heated and melted and the seed crystal is attached to the melt, the heat insulation plate 13 is placed on the heat-insulating ring 15 attached to the lower end of the opening of the gas-flow guiding cylinder 10, the invention is not limited thereto. For example, even when a single-crystal manufacturing apparatus with no heat-insulating ring 15 is used, the invention allows the maintenance of the temperature of the raw material, raw material melt 4, seed crystal 11, and seed chuck 12 as in this embodiment, provided the heat insulation plate 13 can be moved to the same level of the lower end of the opening of the gas-flow guiding cylinder 10.

As shown in FIG. 2, when the single crystal 8 is pulled, the heat insulation plate 13 is mounted on the seed chuck 12 by using the mounting fixture 14 and pulled together with the seed chuck 12 and the seed crystal 11.

The single-crystal manufacturing apparatus 1 of this type enables the heat insulation plate 13 to inhibit heat transfer due to radiation from the raw material to the chamber when the raw material is heated and melted and can thereby melt the raw material even when a low electric power is supplied to the heater. In addition, in the seeding, the heat insulation plate 13 inhibits heat transfer due to radiation from the raw material melt 4, seed crystal 11, and the seed chuck 12 to the chamber. The seed crystal 11 can thereby be sufficiently heated and its temperature can be maintained, so dislocation due to a thermal shock caused by the difference in temperature between the raw material melt 4 and the seed crystal 11 can be inhibited from occurring. The success rate of the dislocation-free seeding can thereby be improved. In addition, the rotational speed of the silicon crystal 8 can be inhibited from temporally decreasing due to the weight of the heat insulation plate 13 when the silicon crystal 8 is pulled. The silicon crystal 8 can consequently be inhibited from generating dislocation while being pulled. The invention needs only the modification of the seed chuck 12 and can therefore be readily introduced to an existing single-crystal manufacturing apparatus.

A method of manufacturing a single crystal according to the invention will now be described by way of example of production of a single crystal with the inventive single-crystal manufacturing apparatus.

The raw material is first contained in the crucibles 2 and 3. To maintain the temperature around the raw material more effectively, the seed chuck 12 that holds no seed crystal 11 is then moved to right above the raw material and the heat insulation plate 13 is placed on the heat-insulating ring 15 attached to the lower end of the gas-flow guiding cylinder 10. In this condition, the raw material is heated and melted into the raw material melt 4 by the heater 5. The seed crystal 11 with a sharp end is then attached to the seed chuck 12 and the wire 9 is unreeled to lower the seed chuck 12 and to bring the seed crystal 11 close to the raw material melt 4. The seed crystal 11 is heated at right above the raw material melt 4 and its temperature is maintained by radiant heat from the surface of the raw material melt 4. As shown in FIG. 1, the heat insulation plate 13 is placed on the heat-insulating ring 15 at this time.

After the seed crystal 11 is sufficiently heated, the seed crystal 11 is slowly brought into contact with the raw material melt 4 and dipped into the melt 4 up to a prescribed diameter. The wire 9 is then reeled while being rotated and the seed chuck 12 is pulled while being rotated, so that the growth of the single crystal 8 is started. The single crystal 8 is pulled while the pulling rate of the single crystal 8 and the power of the heater 5 are controlled such that a desired diameter and quality can be achieved.

As shown in FIG. 2, the inventive single-crystal manufacturing method pulls both the seed crystal 11 and the heat insulation plate 13 with the mounting fixture 14 of the seed chuck 12 during the pulling.

This single-crystal manufacturing method more effectively maintains the temperature around the raw material by the seed chuck 12 and the heat insulation plate 13, thereby allowing the raw material to be melted with a heater having a low electric power. When seeding, since the seed crystal 11 can be sufficiently heated and its temperature can be maintained, the occurrence of dislocation due to a thermal shock caused by the difference in temperature between the raw material melt 4 and the seed crystal 11 can be inhibited. Since the rotational speed of the silicon crystal 8 can be inhibited from temporally decreasing while the single crystal 8 is pulled, the single crystal 8 can be inhibited from generating dislocation during the pulling. The invention needs only the modification of the seed chuck 12 and can therefore be readily introduced to an existing single-crystal manufacturing apparatus.

EXAMPLE

The present invention will be more specifically described below with reference to an example and comparative examples, but the invention is not limited to this example.

Example

A silicon single crystal was manufactured with a single-crystal manufacturing apparatus shown in FIG. 1 by the inventive single-crystal manufacturing method. First, 500 kg of polycrystalline silicon raw material was introduced into a quartz crucible having a diameter of 40 inches (1016 mm). Then, the heat insulation plate was placed on the heat-insulating ring, and in this condition, the polycrystalline silicon raw material was melted while the power of the heater was controlled such that the melting was completed within 30 hours. After the polycrystalline silicon raw material was completely melted, the diameter of the single crystal was increased up to 450 mm by the dislocation-free seeding method and the silicon single crystal was pulled. In this pulling, the mounting fixture shown in FIG. 3 and FIG. 4 was used to pull the heat insulation plate together with the seed crystal.

Comparative Example 1

A 450-mm-diameter silicon single crystal was manufactured under the same conditions except for using a single-crystal manufacturing apparatus with no heat insulation plate.

Comparative Example 2

A 450-mm-diameter silicon single crystal was manufactured under the same conditions except for using a single-crystal manufacturing apparatus using a mounting fixture having no mechanism allowing the heat insulation plate to be mounted such that the heat insulation plate can be rotated independently of the rotation of the seed chuck.

The result was that the power required to completely melt the polycrystalline silicon raw material was 151 kW in the example and comparative example 2, but 192 kW in comparative example 1. The power required to completely melt the polycrystalline silicon raw material in the example and comparative example 2 was decreased by about 21% compared with comparative example 1. If the dislocation-free seeding was evaluated as a success when the crystal was grown with no dislocation until the length of its straight body reached 10 cm, then the success rate of the dislocation-free seeding was 79% in the example, 54% in comparative example 1, and 67% in comparative example 2. The ratio at which the generation of dislocation occurred in the silicon single crystal in the example was 12% lower than comparative example 2. The impurity contamination ratio in the example was 8% lower than comparative example 2.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A single-crystal manufacturing apparatus comprising:
   a main chamber accommodating a crucible configured to contain raw material and a heater to heat the raw material into a raw material melt;
   a pull chamber in which a grown single crystal is pulled and received, the pull chamber being continuously provided above the main chamber;
   a gas-flow guiding cylinder having an opening through which the single crystal passes, the gas-flow guiding cylinder extending downward from a ceiling of the main chamber;
   a heat insulation plate that is level with a lower end of the opening of the gas-flow guiding cylinder when the raw material is heated and melted, and pulled together with the seed crystal when the single crystal is pulled; and
   a rotatable seed chuck configured to hold a seed crystal, the seed chuck including a mounting fixture to mount the heat insulation plate, the mounting fixture having a mechanism allowing the heat insulation plate to be mounted such that the heat insulation plate can be rotated independently of the rotation of the seed chuck,
   the single-crystal manufacturing apparatus being configured to manufacture the single crystal while pulling the seed crystal and the heat insulation plate.

2. The single-crystal manufacturing apparatus according to claim 1, wherein
   the mounting fixture includes an annular lower flange extending from a side surface of the seed chuck and an annular upper flange being rotatable independently of the rotation of the seed chuck while putting the heat insulation plate thereon,
   an annular groove is formed on an upper surface of the lower flange and a lower surface of the upper flange, and three or more spheres are interposed between the annular grooves formed on the upper surface of the lower flange and the lower surface of the upper flange such that the upper flange is placed above the lower flange through the spheres.

3. The single-crystal manufacturing apparatus according to claim 2, wherein the lower flange has a wall protruding upward at an outermost circumference of the lower flange.

4. A method of manufacturing a single crystal wherein the single crystal is manufactured with a single-crystal manufacturing apparatus according to claim 1.

5. A method of manufacturing a single crystal wherein the single crystal is manufactured with a single-crystal manufacturing apparatus according to claim 2.

6. A method of manufacturing a single crystal wherein the single crystal is manufactured with a single-crystal manufacturing apparatus according to claim 3.

* * * * *